(12) United States Patent
Sato et al.

(10) Patent No.: US 10,263,597 B2
(45) Date of Patent: Apr. 16, 2019

(54) CRYSTAL UNIT

(71) Applicant: NIHON DEMPA KOGYO CO., LTD., Tokyo (JP)

(72) Inventors: Yoshiharu Sato, Saitama (JP); Kenji Shimao, Saitama (JP); Hirokazu Iwata, Saitama (JP)

(73) Assignee: NIHON DEMPA KOGYO CO., LTD., Tokyo (JP)

(*) Notice: Subject to any disclaimer, the term of this patent is extended or adjusted under 35 U.S.C. 154(b) by 223 days.

(21) Appl. No.: 15/255,117

(22) Filed: Sep. 1, 2016

(65) Prior Publication Data
US 2017/0070206 A1 Mar. 9, 2017

(30) Foreign Application Priority Data
Sep. 3, 2015 (JP) .................................. 2015-173455

(51) Int. Cl.
| | |
|---|---|
| *H03H 9/19* | (2006.01) |
| *H03H 9/13* | (2006.01) |
| *H03H 3/02* | (2006.01) |
| *H03H 9/02* | (2006.01) |
| *H03H 9/10* | (2006.01) |

(52) U.S. Cl.
CPC .............. *H03H 9/132* (2013.01); *H03H 3/02* (2013.01); *H03H 9/02023* (2013.01); *H03H 9/1021* (2013.01); *H03H 9/19* (2013.01); *H03H 2003/022* (2013.01)

(58) Field of Classification Search
CPC .................................. H03H 9/19; H03H 9/132
See application file for complete search history.

(56) References Cited

U.S. PATENT DOCUMENTS

| | | | |
|---|---|---|---|
| 2011/0068660 A1* | 3/2011 | Naito ....................... | H03H 3/04 310/367 |
| 2015/0229291 A1* | 8/2015 | Lim ......................... | H03H 9/19 310/321 |

FOREIGN PATENT DOCUMENTS

| | | |
|---|---|---|
| JP | 2014-011650 | 1/2014 |
| JP | 2014-027505 | 2/2014 |

* cited by examiner

*Primary Examiner* — Thomas M Dougherty
*Assistant Examiner* — Karen B Addison
(74) *Attorney, Agent, or Firm* — JCIPRNET

(57) ABSTRACT

A crystal unit includes an AT-cut crystal element, excitation electrodes, extraction electrodes. The AT-cut crystal element has an approximately rectangular planar shape. The excitation electrodes are disposed on front and back of principal surfaces of the AT-cut crystal element. The extraction electrodes are extended from the excitation electrodes to a side of one side of the AT-cut crystal element via a side surface of the AT-cut crystal element. Assuming that an extraction angle of the extraction electrode from the principal surface to the side surface is defined as an angle θ with respect to an X-axis of a crystallographic axis of a crystal, the angle θ is equal to or greater than 59 degrees and equal to or less than 87 degrees.

5 Claims, 12 Drawing Sheets

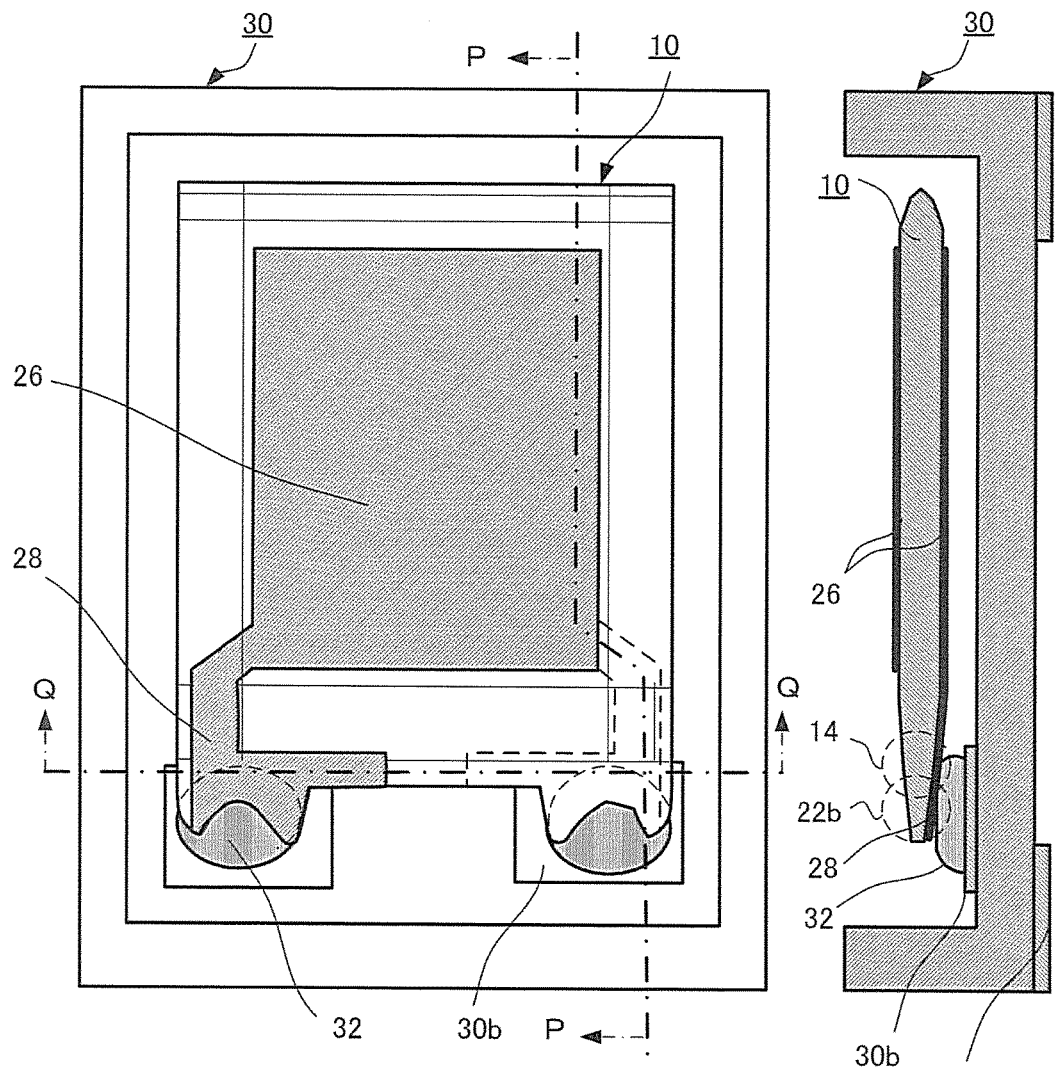
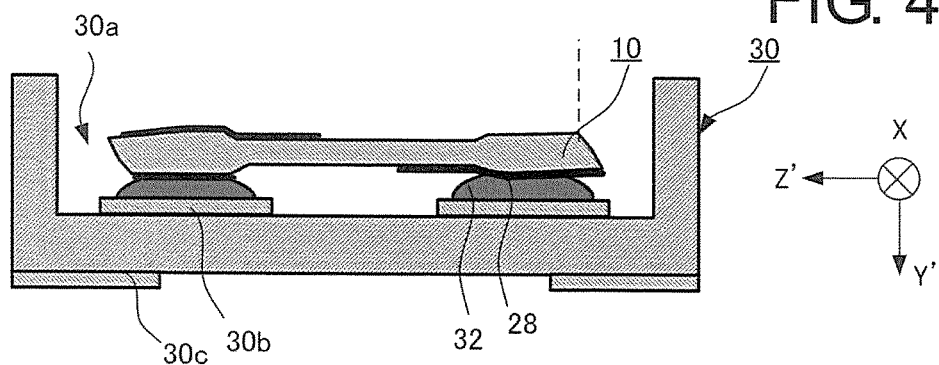
FIG. 4A
FIG. 4B
FIG. 4C

CRYSTAL UNIT

CROSS-REFERENCE TO RELATED APPLICATIONS

This application is based on and claims priority under 35 U.S.C. § 119 to Japanese Patent Application No. 2015-173455, filed on Sep. 3, 2015, the entire content of which is incorporated herein by reference.

TECHNICAL FIELD

This disclosure relates to a crystal unit using an AT-cut crystal element.

DESCRIPTION OF THE RELATED ART

As downsizing of an AT-cut crystal unit proceeds, it has become difficult to manufacture crystal elements for crystal units by a manufacturing method of mechanical processing. Accordingly, an AT-cut crystal element manufactured using photolithography technique and wet etching technique has been developed.

Such AT-cut crystal element is, for example, secured to and mounted in a container such as a ceramic package with a conductive adhesive or a similar adhesive, thus ensuring configuring a crystal unit. To meet specifications for CI (crystal impedance), this type of crystal unit has been variously devised.

For example, as disclosed in, for example, FIG. 10A to FIG. 11B in Japanese Unexamined Patent Application Publication No. 2014-27505, inclined portions are formed at end portions of a crystal element at which the crystal element decreases in thickness. The crystal element is secured to a container at these inclined portions with conductive adhesive. With this structure, vibration energy at an excitation portion of the crystal element can be cut off between the excitation portion and the inclined portions, thereby reducing a deterioration of a property of a crystal unit can be expected.

For example, Japanese Unexamined Patent Application Publication No. 2014-11650 discloses that extraction electrodes extracted from excitation electrodes, which are disposed on both principal surfaces of a crystal element, to mounting portions are extended to an m surface, which is a side surface of the crystal element, of a crystal. With this structure, since the extraction electrodes are not present directly in a propagation direction of vibrations, this ensures a reduction in a leakage of energy at the excitation portions via the extraction electrodes, achieving an improvement in CI.

However, the Patent Literatures do not describe a preferable condition on a wiring direction of an extraction electrode and a preferable side surface shape of the crystal element in the above-described conventional structures. According to study on these applications by the inventor of the disclosure, it has been proved that focusing on the condition and the shape can improve properties of a crystal unit.

A need thus exists for a crystal unit which is not susceptible to the drawback mentioned above.

SUMMARY

There is provided a crystal unit that includes an AT-cut crystal element, excitation electrodes, and extraction electrodes. The AT-cut crystal element has a planar shape which is approximately a rectangular shape. The excitation electrodes are disposed on front and back of principal surfaces of the AT-cut crystal element. The extraction electrodes are extended from the excitation electrodes to a side of one side of the crystal element via a side surface of the AT-cut crystal element. Assuming that an extraction angle of the extraction electrode from the principal surface to the side surface is defined as an angle θ with respect to an X-axis of a crystallographic axis of a crystal of the AT-cut crystal element, the angle θ is equal to or greater than 59 degrees and equal to or less than 87 degrees.

BRIEF DESCRIPTION OF THE DRAWINGS

The foregoing and additional features and characteristics of this disclosure will become more apparent from the following detailed description considered with reference to the accompanying drawings, wherein:

FIG. 4A to FIG. 4C are drawings describing a structure of the crystal unit;

DETAILED DESCRIPTION

Figures 1A, 1B, 1C:
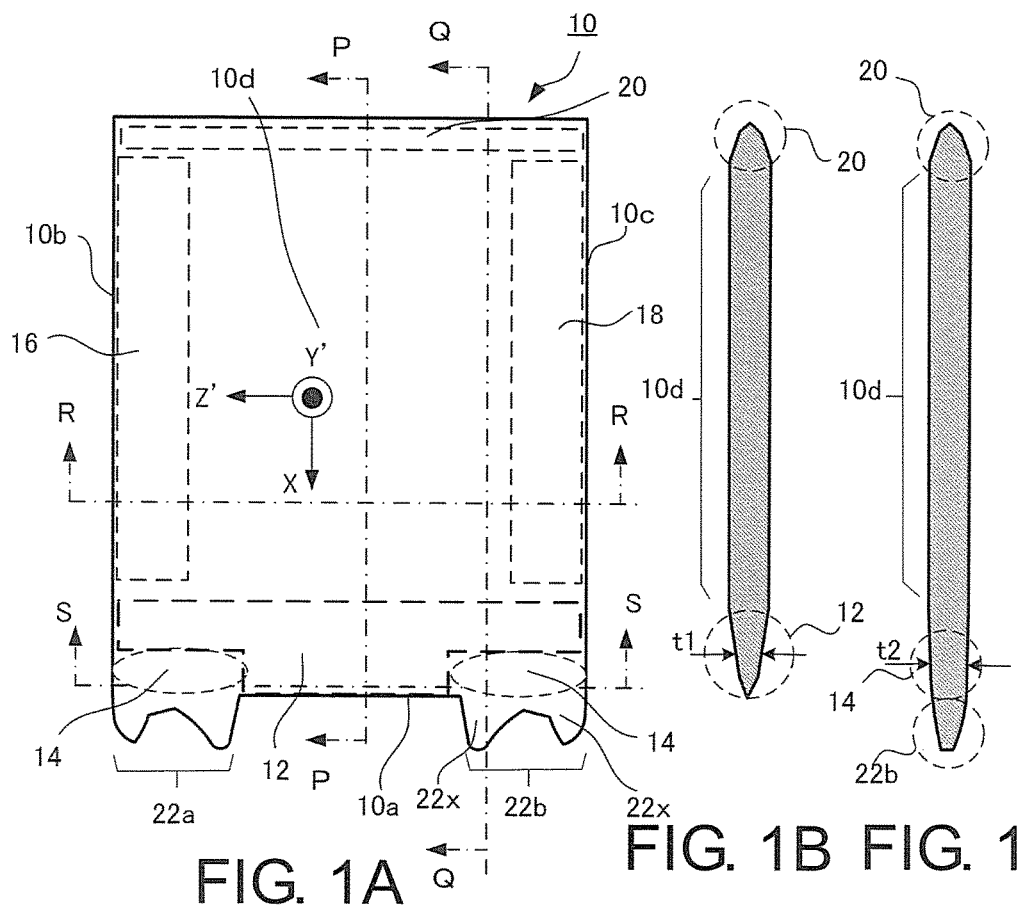
FIG. 1A to FIG. 1E are explanatory drawings of an AT-cut crystal element 10 provided with a crystal unit according to an embodiment.

The following description describes embodiments of a crystal unit according to this disclosure with reference to the drawings. Each drawing used in the description is merely illustrated schematically for understanding this disclosure. In each drawing used in the description, like reference numerals designate corresponding or identical elements, and therefore such elements may not be further elaborated here. Shapes, dimensions, materials, and a similar factor described in the following explanations are merely preferable examples within the scope of this disclosure. Therefore, this disclosure is not limited to only the following embodiments.

1. Structure of AT-Cut Crystal Element

Figure 1D:
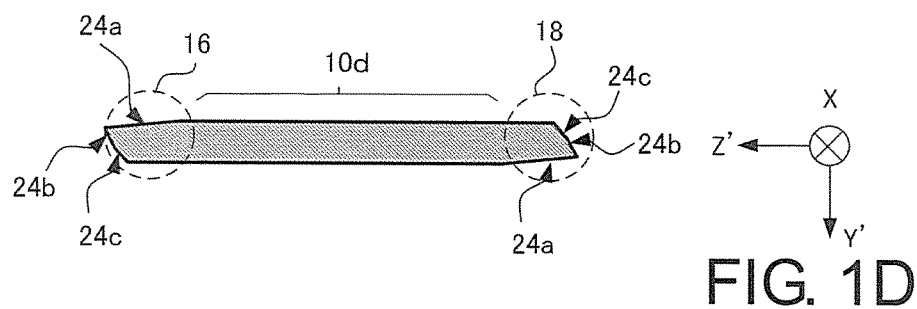
Figure 1E:
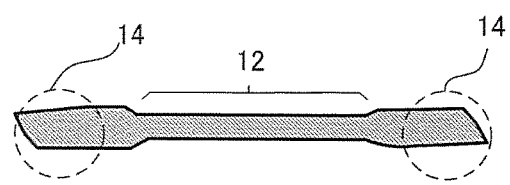
Figure 2A:
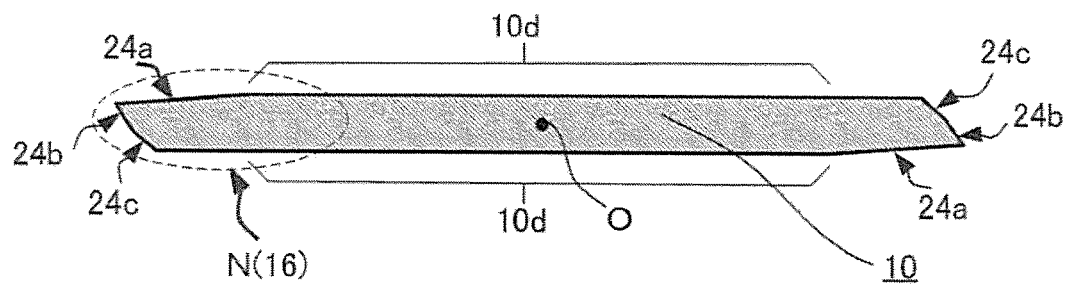
FIG. 2A and FIG. 2B are explanatory drawings of especially a third inclined portion and a fourth inclined portion of the crystal element 10.
Figure 2B:
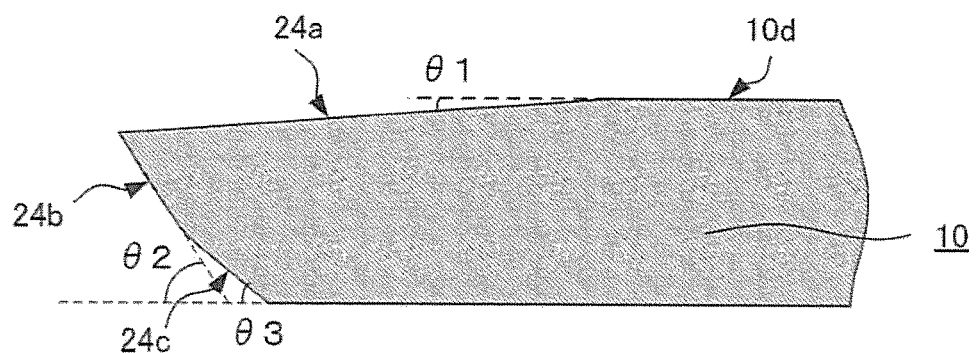

First, the following description describes an AT-cut crystal element 10 provided with a crystal unit of this disclosure mainly with reference to FIG. 1A to FIG. 2B. FIG. 1A to FIG. 1E are explanatory drawings of this crystal element 10. Especially, FIG. 1A illustrates a plan view of the crystal element 10, and FIG. 1B to FIG. 1E are sectional drawings of the crystal element 10 each taken along the line P-P, the line Q-Q, the line ID-ID, and the line IE-IE in FIG. 1A. FIG. 2A and FIG. 2B illustrate parts illustrated in FIG. 1D in further detail. Especially, FIG. 2B illustrates enlarged N part (namely, a third inclined portion) in FIG. 2A.

Here, each of coordinate axes X, Y', and Z' shown in FIG. 1A and FIG. 1D are crystallographic axes of a crystal in the AT-cut crystal element 10. The AT-cut crystal element itself is described in, for example, literature: "Handbook of Quartz Crystal Device" (Fourth Edition, page 7 or other pages, published by Quartz Crystal Industry Association of Japan, March 2002) in detail. Therefore, the explanation will be omitted.

The crystal element 10 of this embodiment is an AT-cut crystal element having a planar shape which is approximately a rectangular shape. The crystal element 10 is secured to a container (see 30 in FIG. 4A and FIG. 4B) with securing members (see 32 in FIG. 4A and FIG. 4B) at a first side 10a side, which is one side of the crystal element 10. This crystal element 10 includes a first inclined portion 12, second inclined portions 14, a first secured portion 22a, and a second secured portion 22b. The first inclined portion 12 is inclined such that the crystal element 10 decreases in thickness from the proximity of the first side 10a to this first side 10a. The second inclined portions 14 are disposed on respective both ends of the first side 10a. The second inclined portions 14 are formed integrally with the first inclined portion 12. The second inclined portions 14 are inclined gentler than the first inclined portion 12. The first secured portion 22a and the second secured portion 22b are formed integrally with the second inclined portions 14. The first secured portion 22a and the second secured portion 22b each project out from the first side 10a to outside the crystal element 10 to be used for securing with the securing members.

The crystal element 10 of this embodiment is an approximately rectangular-shaped crystal element whose first side 10a is parallel to a Z'-axis of a crystal and a second side 10b and a third side 10c, which intersect with the first side 10a, are parallel to an X-axis of the crystal and are long in the X-axis direction.

Accordingly, the first and the second secured portions 22a and 22b of this embodiment each project out in a direction parallel to the X-axis of the crystal. Moreover, the first and the second secured portions 22a and 22b of this embodiment each have a convex shape having two protrusions 22x, which convexly project out in a direction parallel to the X-axis of the crystal.

Compared with the first inclined portion 12, the second inclined portions 14 are inclined gently. Therefore, a thickness t2 (FIG. 1C) of the second inclined portion 14 in a direction parallel to a Y'-axis of the crystal is thicker than a thickness t1 (FIG. 1B) of the first inclined portion 12 in the identical direction. These second inclined portions 14 are parts continuous to the first and the second secured portions 22a and 22b; therefore, the thick thickness of the second inclined portions 14 contributes to an improvement in an impact resistance of the crystal unit after the crystal element 10 is secured to the container.

In this embodiment, the crystal element 10 is secured to the container at an end portion on a +X-side of the crystal element 10; however, the crystal element 10 may be secured at a −X-side of the crystal element 10. Note that, a dimension of the first inclined portion 12 in the X direction is longer than that of a fifth inclined portion 20. Accordingly, disposing the first and the second secured portions at the end portions on the +X-side of the crystal element 10 easily widens between excitation electrodes 26 and the secured portions 22a and 22b, thereby preferable in terms of improvement in CI. This disclosure features an extraction angle θ of an extraction electrode 28 and a side surface shape of the crystal element 10, which will be described later. Therefore, the secured portions 22a and 22b are not necessary, and the crystal element 10 may be secured to the container at the first inclined portion 12 without disposing the secured portions 22a and 22b.

The first inclined portion 12 and the second inclined portions 14 of this embodiment each have a structure inclined in two stages along the X-axis direction of the crystal (see FIG. 1B and FIG. 1C). Note that, the numbers of stages of the inclined portions are not limited to this. It is only necessary that an inclined portion be inclinedly connected to a principal surface 10d of the crystal element 10. The principal surface of the crystal element 10 is a region excluding the first to the fifth inclined portions 12 to 20 of the crystal element 10 and is a region corresponding to an X-Z' plane of the crystal.

The crystal element 10 of this embodiment includes a third inclined portion 16 and a fourth inclined portion 18. The third inclined portion 16 and the fourth inclined portion 18 are inclined such that the crystal element 10 decreases in thickness from the proximities of the respective second side 10b and third side 10c, which are two sides intersecting with the first side 10a, to these sides 10b and 10c.

These third inclined portion 16 and fourth inclined portion 18 each have three surfaces, first to third surfaces 24a, 24b, and 24c in this embodiment (FIG. 1D). The first surface 24a is a surface intersecting with the principal surface 10d of this crystal element 10. Moreover, the first surface 24a is a surface corresponding to a surface where the principal surface 10d is rotated by θ1 (see FIG. 2B) with the X-axis of the crystal as a rotation axis. Further, in this embodiment, the first surface 24a, the second surface 24b, and the third surface 24c intersect in this order. Moreover, the second surface 24b is a surface corresponding to a surface where the principal surface 10d is rotated by θ2 (see FIG. 2B) with the X-axis of the crystal as a rotation axis. The third surface 24c is a surface corresponding to a surface where the principal surface 10d is rotated by θ3 (see FIG. 2B) with the X-axis of the crystal as a rotation axis.

Although details of these angles θ1, θ2, and θ3 will be described later in the "4. Explanation of Experimental Results" section, the following description has been found to be preferable: θ1=4°±3.5°, θ2=−57°±5°, θ3=−42°±5° and more preferably θ1=4°±3°, θ2=−57°±3°, and θ3=−42°±3°.

In the crystal element 10 of this embodiment, respective two side surfaces (Z' surfaces) intersecting with the Z'-axis of the crystal (namely, the third inclined portion 16 and the fourth inclined portion 18) have a relationship of point symmetry around a center point O (see FIG. 2A) of the crystal element 10. The point symmetry mentioned here includes a point symmetry regarded as substantially identical even if the shapes slightly differ. Compared with the case of not having the relationship of point symmetry, with this point symmetry, the crystal unit exhibits good property, and therefore the point symmetry is preferable.

The crystal element 10 of this embodiment includes the fifth inclined portion 20 on a side at a side opposed to the first side 10a. This fifth inclined portion 20 is an inclined portion where the crystal element decreases in thickness as the crystal element approaches this side (see FIG. 1B and FIG. 1C).

2. Configurations of Electrodes and Crystal Unit

Figure 3A:
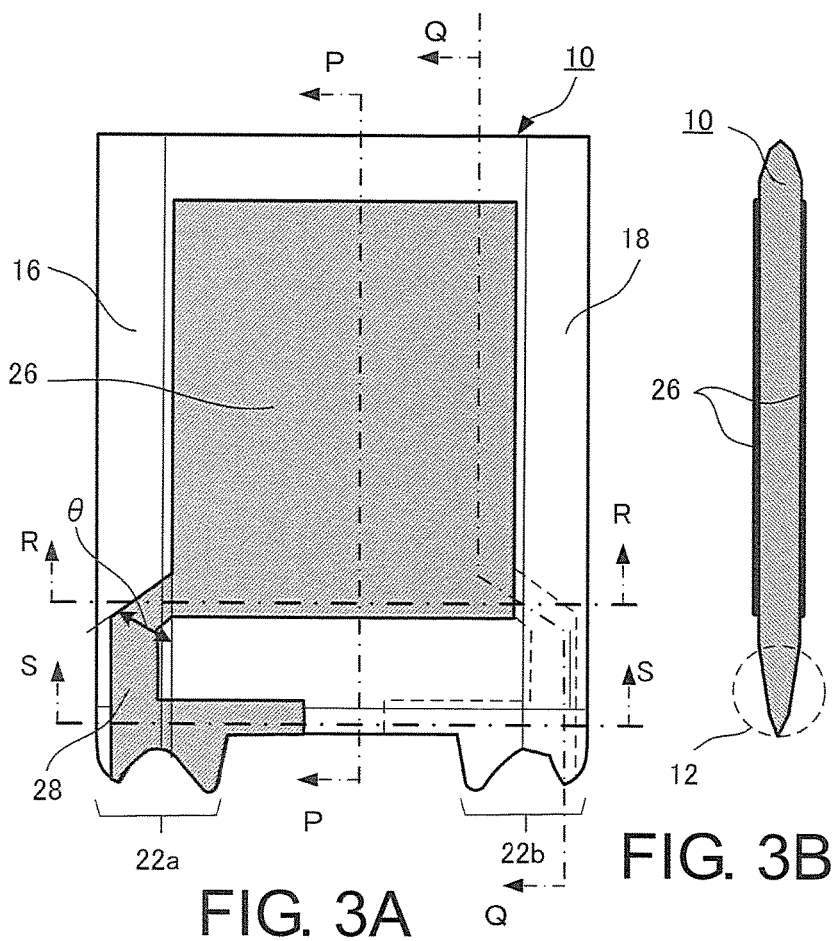
FIG. 3A to FIG. 3E are explanatory drawings of an excitation electrode and an extraction electrode of the crystal unit according to the embodiment.
Figures 3B, 3C:
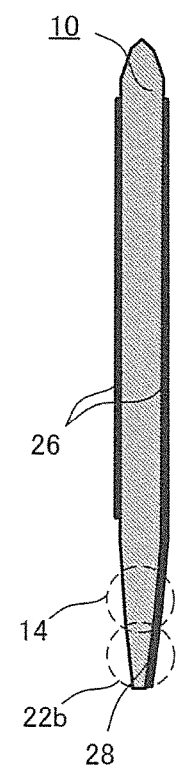
Figure 3D:
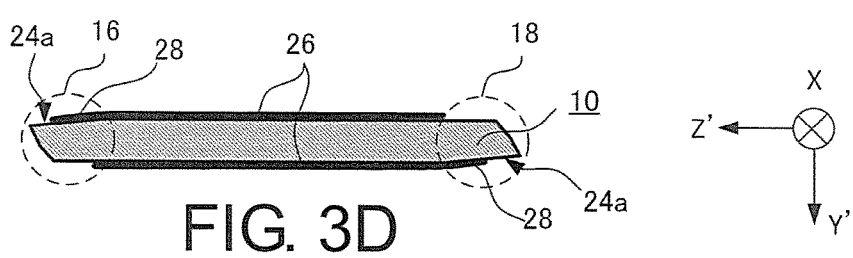
Figure 3E:
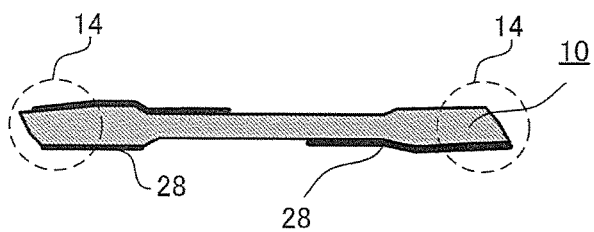

The following description describes configurations of the excitation electrode 26 and the extraction electrode 28 mainly with reference to FIG. 3A to FIG. 4C and an overall configuration of the crystal unit. FIG. 3A to FIG. 3E illustrate the crystal element 10, which is illustrated in FIG. 1A, that includes the excitation electrodes 26 and the extraction electrodes 28. Especially, FIG. 3A is a plan view of the crystal element 10 including these electrodes. FIG. 3B to 3E are sectional drawings of the crystal element 10 each taken along the line P-P, the line Q-Q, the line R-R, and the line S-S in FIG. 3A. FIG. 4A to 4C illustrate the crystal element 10 with the electrodes 26 and 28 mounted to the container 30. Especially, FIG. 4A is a plan view of the crystal element 10. FIG. 4B and FIG. 4C are sectional drawings each taken along the line P-P and the line Q-Q in FIG. 4A.

In this embodiment, the excitation electrodes 26 are disposed on respective front and back of the principal surfaces 10d of the crystal element 10. The extraction electrode 28 is disposed from the excitation electrode 26 to the corresponding secured portion of the first secured portion 22a or the second secured portion 22b via the corresponding inclined portion of the third inclined portion 16 or the fourth inclined portion 18. Moreover, the extraction electrode 28 is extracted via the first surface 24a, which is the inclined portion, corresponding to the third inclined portion 16 or the fourth inclined portion 18. Specifically, the excitation electrode 26 on the front surface side of the principal surface 10d in FIG. 3A reaches the first secured portion 22a via the first surface 24a of the third inclined portion 16. The excitation electrode 26 on the back surface side of the principal surface 10d in FIG. 3A reaches the second secured portion 22b via the first surface 24a of the fourth inclined portion 18. Accordingly, this extraction structure can prevent the extraction electrodes 28 from reaching the secured portions 22a and 22b directly via over the first inclined portion 12 and the second inclined portions 14.

The following description has been found through experiments by the inventor. In the case where an extraction angle of the extraction electrode 28 from the principal surface 10d to the third or the fourth inclined portion 16 or 18 is defined as an angle θ with respect to the X-axis of the crystallographic axis of the crystal (see FIG. 3A), this extraction angle θ is preferably: equal to or greater than 59 degrees and equal to or less than 87 degrees. More preferably, this θ is: equal to or greater than 62 degrees and equal to or less than 75 degrees. Further preferably, this θ is: equal to or greater than 64 degrees and equal to or less than 74 degrees. This configuration ensures improving CI (crystal impedance) of the crystal unit. The details will be described later in the "4. Explanation of Experimental Results" section.

As illustrated in FIG. 4A, FIG. 4B and FIG. 4C, the crystal element 10 with the excitation electrodes 26 and the extraction electrodes 28 is mounted inside a concave portion 30a of, for example, the ceramic package 30 as the container. A frequency adjustment or a similar operation is performed on the crystal element 10 and a lid member (not illustrated) seals the crystal element 10, thus ensuring configuring the crystal unit. Specifically, the secured portions 22a and 22b and a part of the first inclined portion 12 and the second inclined portions 14 of the crystal element 10 and securing pads 30b of the container 30 are secured with the securing members (for example, conductive adhesives) 32. Then, the crystal unit can be configured through the frequency adjustment and the sealing. As shown in FIG. 4B, the crystal unit has a mounting terminal 30c.

3. Example of Method for Manufacturing AT-Cut Crystal Element 10

Figure 6A:
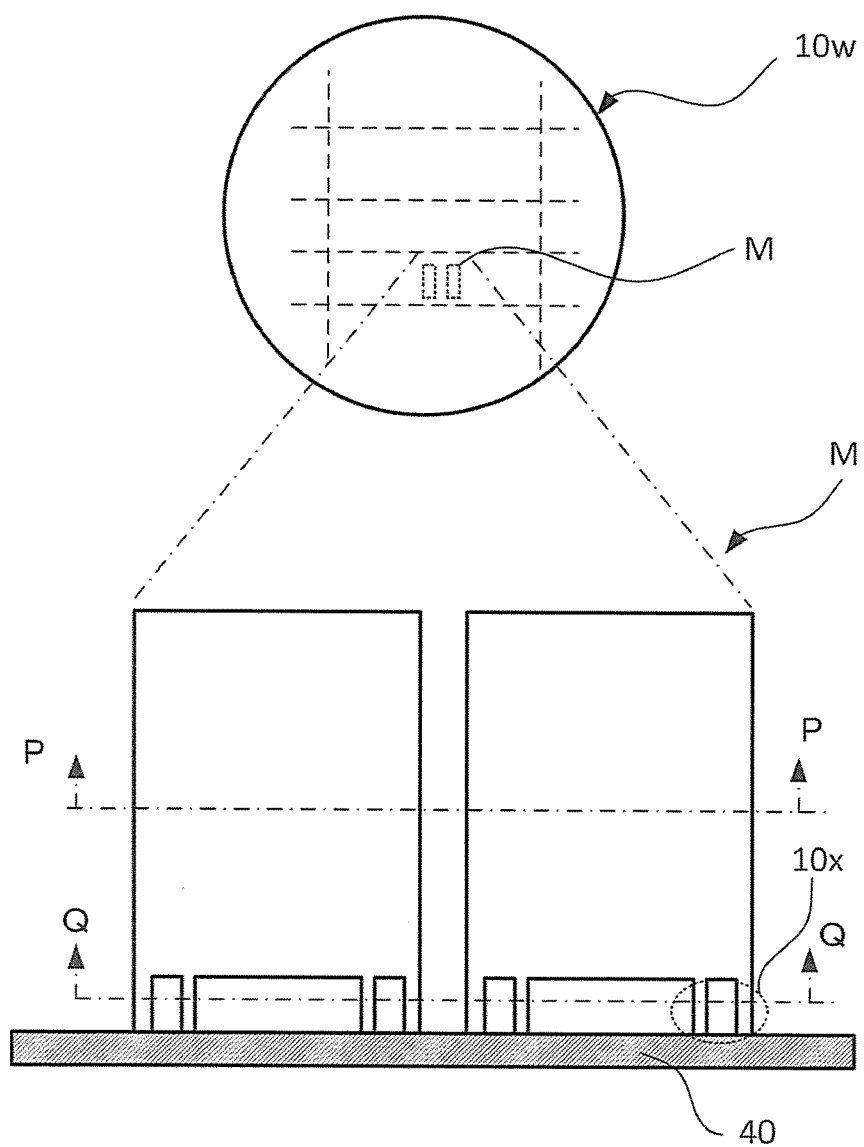
FIG. 6A, FIG. 6B, and FIG. 6C are explanatory drawings of the example of the method for manufacturing the crystal element 10 continuous from FIG. 5C.
Figure 6B:
Figure 6C:
Figure 7A:
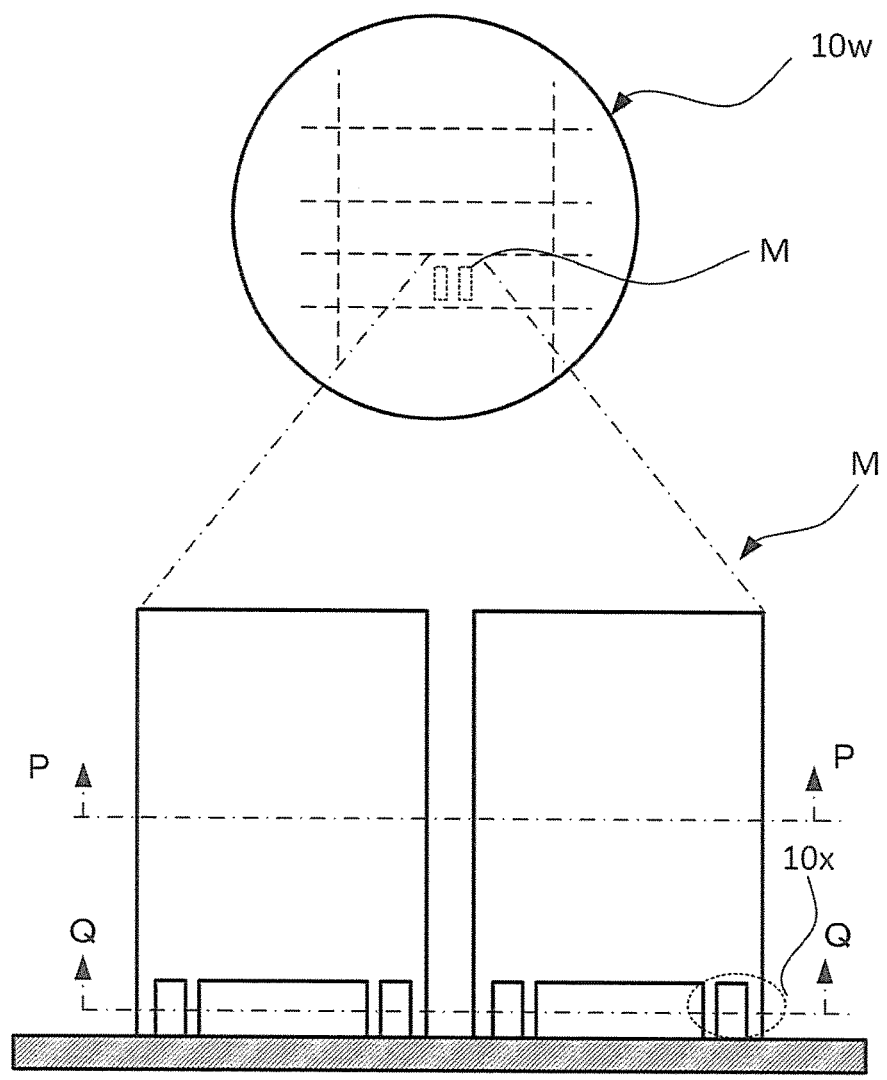
FIG. 7A, FIG. 7B, and FIG. 7C are explanatory drawings of the example of the method for manufacturing the crystal element 10 continuous from FIG. 6C.
Figure 7B:
Figure 7C:
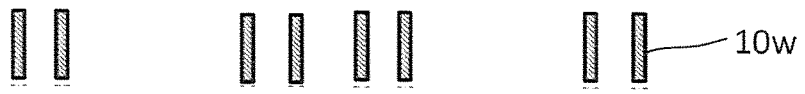

Next, a description will be given of the example of the method for manufacturing the AT-cut crystal element 10 provided with the crystal unit according to the embodiment with reference to FIG. 5A to FIG. 8B. A large number of the crystal elements 10 can be manufactured from a quartz-crystal wafer by photolithography technique and wet etching technique. Accordingly, some drawings in drawings used to explain the example of the manufacturing method include plan views of a quartz-crystal wafer 10w and enlarged plan views of a part M of the quartz-crystal wafer 10w. Further, some drawings in the drawings used to explain the example of the manufacturing method also include sectional drawings. In all drawings using the sectional drawings in FIG. 5A to FIG. 8B, the sectional drawings taken along the line P-P in FIGS. 5A, 6A, 7A, and 8A are illustrated in FIGS. 5B, 6B, 7B, and 8B, and the sectional drawings taken along the line Q-Q in FIGS. 5A, 6A, and 7A are illustrated in FIGS. 5C, 6C, and 7C.

Figure 5A:
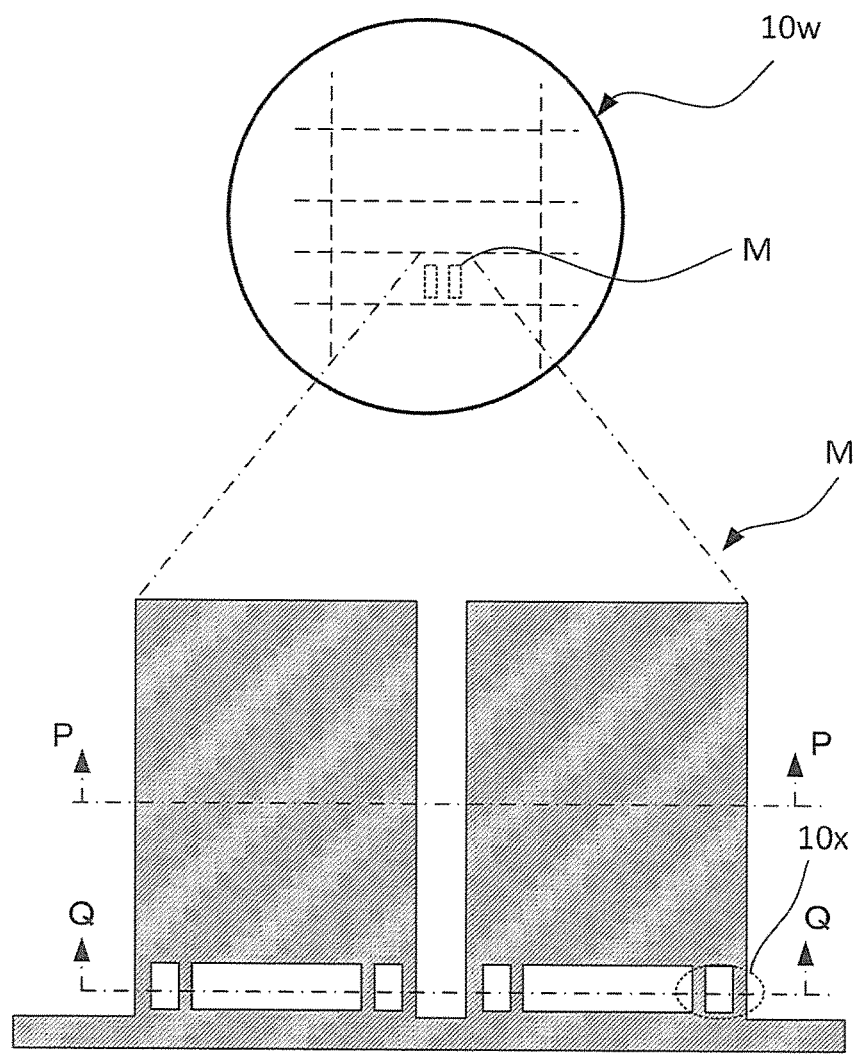
FIG. 5A, FIG. 5B, and FIG. 5C are explanatory drawings of an example of a method for manufacturing the crystal element 10.
Figure 5B:
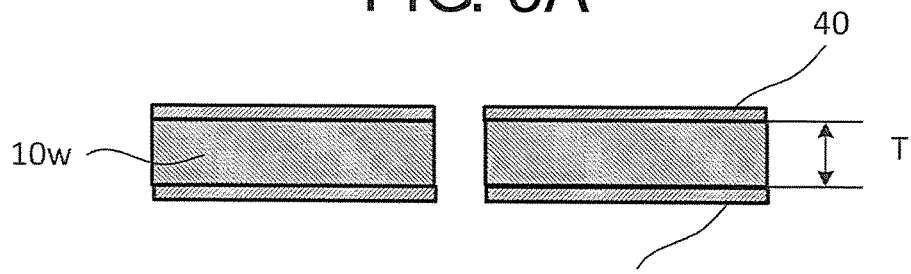
Figure 5C:
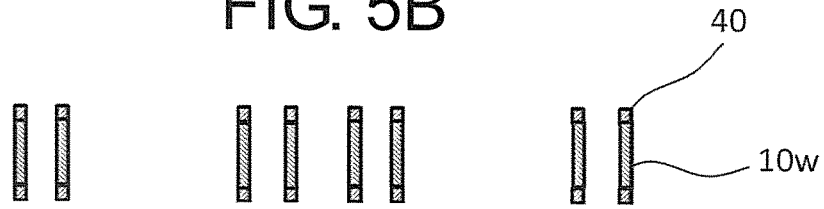

In the example of the manufacturing method, first, the quartz-crystal wafer 10w is prepared (FIG. 5A). While, as it is well known, the oscillation frequency of the AT-cut crystal element 10 is approximately determined by the thickness of the principal surface (the X-Z' surface) part of the crystal element 10, the quartz-crystal wafer 10w is a wafer with a thickness T (see FIG. 5B) thicker than the final thickness t (see FIG. 7B) of the crystal element 10.

Next, the well-known photolithography technique is used to form etching resist masks 40, which are masks to foam the outer shape of the crystal element, on both front and back surfaces of the quartz-crystal wafer 10w. The etching resist masks 40 according to the embodiment are configured of a part corresponding to the outer shape of the crystal element, a frame part that holds each crystal element, and a connecting portion that connects the crystal element and the frame part (a part indicated by 10x in FIG. 5A). The etching resist masks 40 are formed to be opposed to one another on the front and back of the quartz-crystal wafer 10w.

The quartz-crystal wafer 10w after the etching resist masks 40 are formed is dipped in an etching solution mainly composed of hydrofluoric acid for a predetermined period. This process dissolves parts of the quartz-crystal wafer 10w without being covered with the etching resist masks 40 to provide the rough outer shape of the crystal element 10.

Next, the etching resist masks 40 are removed from the quartz-crystal wafer 10w. Then, the example of the manufacturing method removes only the parts of the etching resist masks 40 corresponding to the crystal element 10 and connecting portions 10x and leaves the part corresponding to the frame portion (FIG. 6A).

Figure 10A:
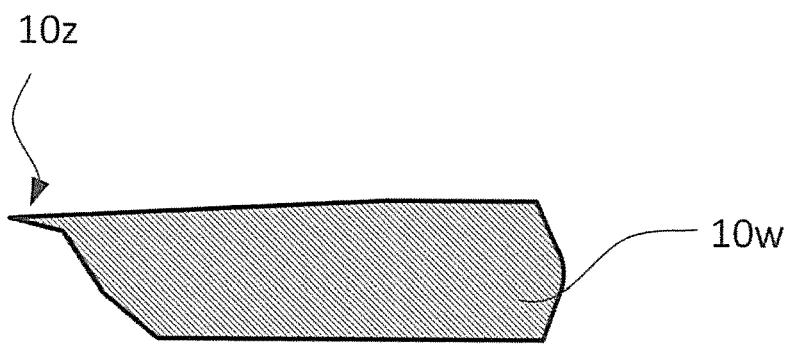
FIG. 10A to FIG. 10C are drawings especially describing an etching state of the example of the method for manufacturing the crystal element 10.
Figure 10B:
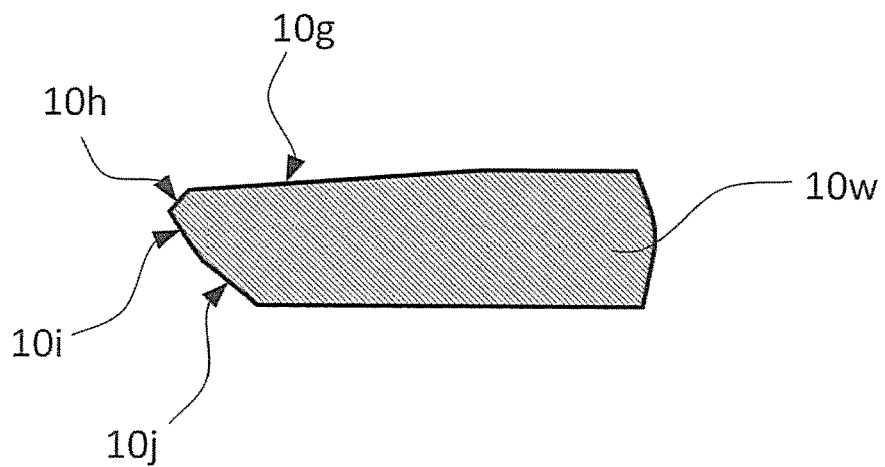
Figure 10C:
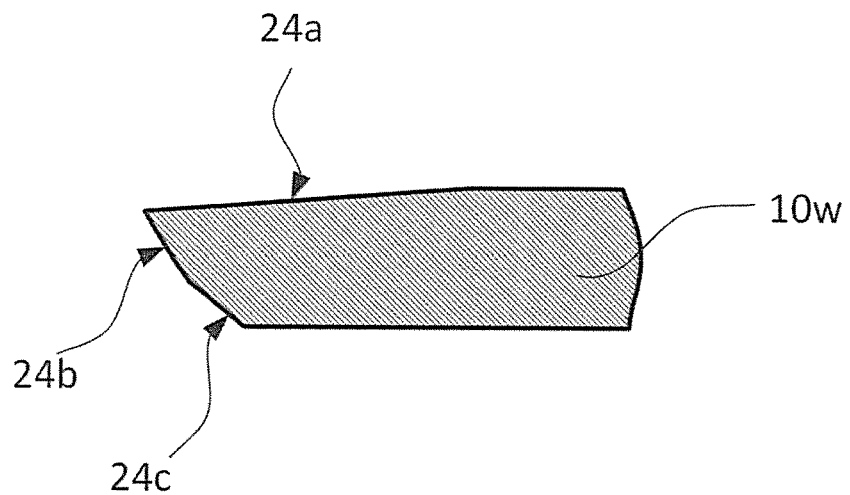

Next, this quartz-crystal wafer 10w is dipped again in the etching solution mainly composed of hydrofluoric acid for the predetermined period. Here, the predetermined period is a period during which the thickness t (FIG. 7B) of a forming scheduled region for the crystal element 10 can satisfy the specification of an oscillation frequency required to the crystal element 10, and the Z'-side surface of the crystal element 10 can be constituted of the first to the third surfaces 24a to 24c according to the disclosure. The period can be determined by experiments in advance. The experiments performed by the inventor have found that, as the etching proceeds, the Z' surface of the crystal element 10 changes its shape. FIG. 10A to FIG. 10C are explanatory drawings illustrating a part of the quartz-crystal wafer 10w and are sectional drawings illustrating the change in shape according to an amount of etching to a part corresponding to the third inclined portion of the crystal element. The following description has been found. As the etching proceeds, the state changes: a protrusion 10z remains as illustrated in FIG. 10A, the quartz-crystal wafer 10w is constituted of four surfaces of first surface 10g, second surface 10h, third surface 10i and fourth surface 10j (a fourth surface generating state) as illustrated in FIG. 10B, and the quartz-crystal wafer 10w is constituted of three surfaces of the first to the third surfaces 24a, 24b, and 24c according to this disclosure (the state of this disclosure) as illustrated in FIG. 10C in this order. Moreover, the experiments have found that, to obtain the side surfaces constituted of the three surfaces of the first to the third surfaces of this disclosure, in the case where the etching is performed in the predetermined etchant, the etching temperature, and a similar condition, it is necessary to perform the etching on the quartz-crystal wafer 10w until the quartz-crystal wafer 10w has the thickness in a range of 55% to 25% with respect to an initial thickness T. Therefore, the initial thickness T, the above-described etching period, and a similar factor are determined such that the specification of the oscillation frequency and the three surfaces of the first to the third surfaces are obtained.

Figure 8A:
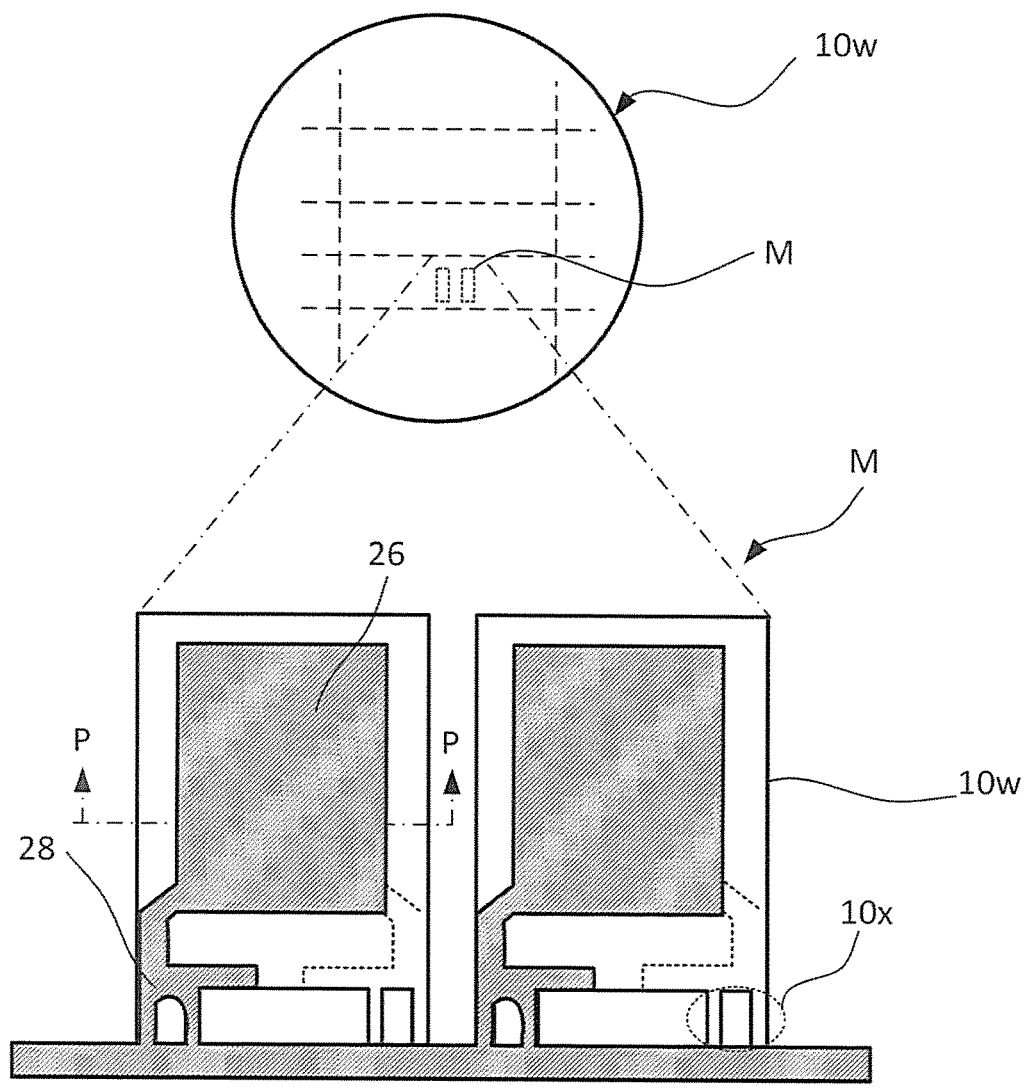
FIG. 8A and FIG. 8B are explanatory drawings of the example of the method for manufacturing the crystal element 10 continuous from FIG. 7C.
Figure 8B:
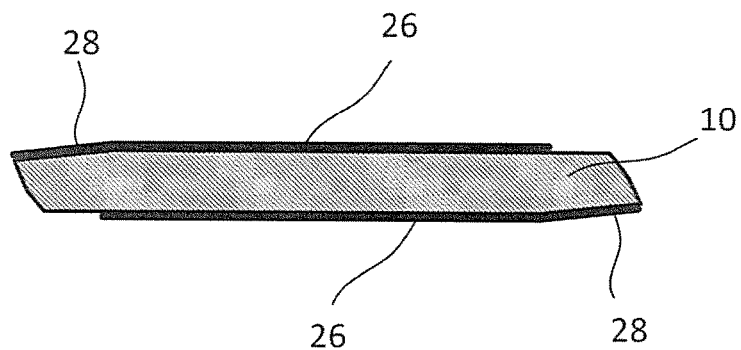

Next, the etching resist masks are removed from the quartz-crystal wafer after the above-described etching is performed to expose a crystal surface (not illustrated). Then, a well-known film formation method is used to form a metal film (not illustrated) for forming excitation electrodes and extraction electrodes of the crystal unit on the entire surface of the quartz-crystal wafer. Next, the well-known photolithography technique and metal etching technique are used to perform a patterning on the metal film in an electrode shape to form the excitation electrodes 26 and the extraction electrodes 28 (FIG. 8A and FIG. 8B). This ensures obtaining a crystal unit that includes the crystal element 10, the excitation electrodes 26, and the extraction electrodes 28.

Figure 9:
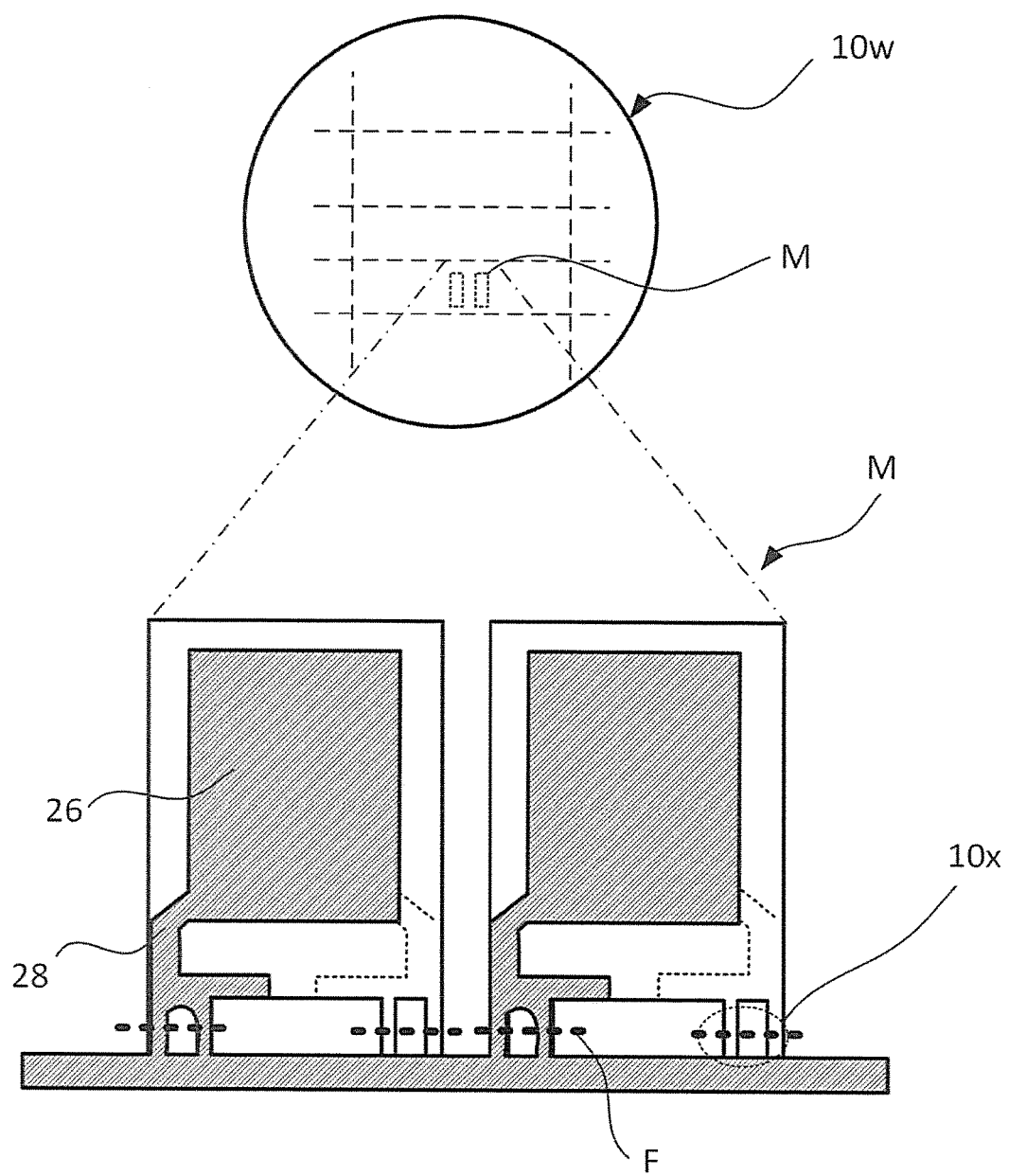
FIG. 9 is an explanatory drawing of the example of the method for manufacturing the crystal element 10 continuous from FIG. 8B.

In a state illustrated in FIG. 8B, the crystal element 10 is connected to the quartz-crystal wafer 10w via the connecting portions 10x. Therefore, at first, an appropriate external force F (FIG. 9) is applied to the connecting portions 10x to separate the crystal elements 10 from the quartz-crystal wafer 10w at, for example, the centers of the connecting portions 10x and individually dice the crystal elements 10 (FIG. 9). With this disclosure, since the connecting portion 10x has an opening at the center, after this individual dicing process, the parts of the connecting portions 10x remaining on the crystal element 10 side are actively used as the first and the second secured portions 22a and 22b. Devising a design of the connecting portion 10x ensures obtaining the second inclined portion.

Mounting the crystal element thus formed to the container 30 as illustrated in FIG. 4A to FIG. 4C ensures obtaining crystal unit according to the embodiment.

4. Explanation of Experimental Results 4-1. First to Third Surfaces

Figure 11A:
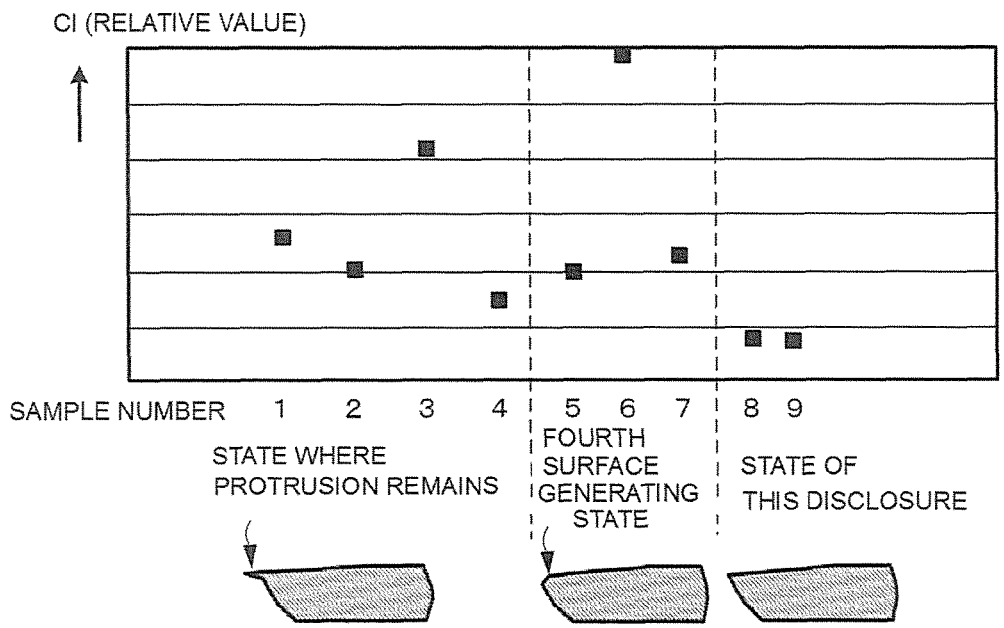
FIG. 11A and FIG. 11B are explanatory drawings of first to third surfaces of the crystal element 10.
Figure 11B:
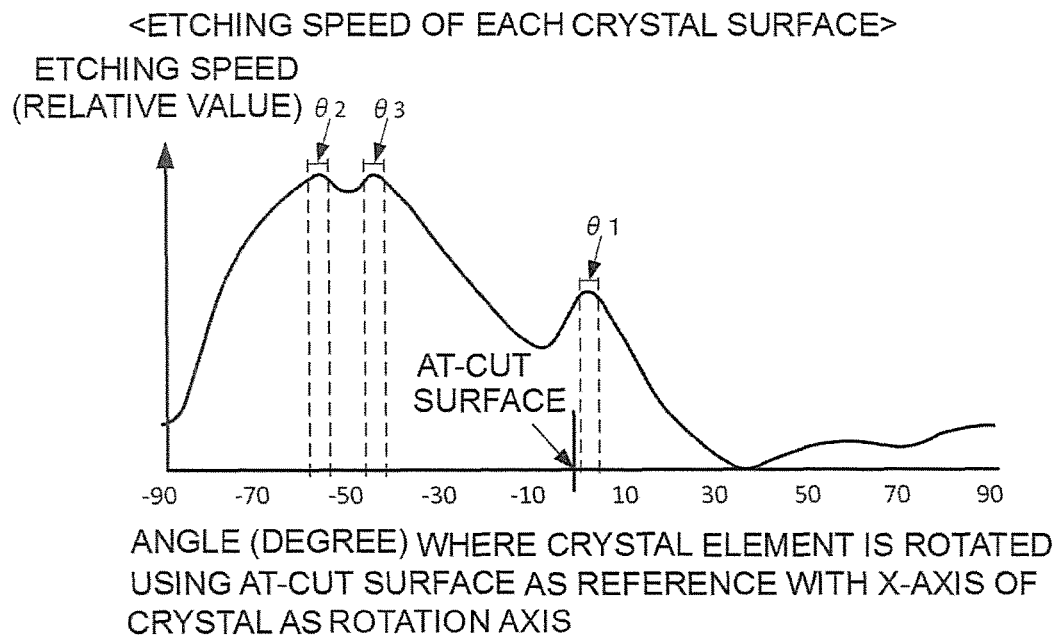

The following description describes the first to the third surfaces 24a, 24b, and 24c with reference to FIG. 11A and FIG. 11B.

FIG. 11A is a drawing describing how the CI (the crystal impedance) of the crystal units configured of the crystal elements are different depending on the difference in the shape of the Z' surfaces of the crystal elements, namely, the difference in the shapes of the third inclined portion and the fourth inclined portion. FIG. 11A indicates sample numbers of the crystal elements used in the experiment and features of the shape of the Z' surface of each sample (features corresponding to FIG. 10A to FIG. 10C) on the horizontal axis, and indicates the CI (the relative value) on the vertical axis. The oscillation frequency of the experimental sample is close to 38 MHz.

As apparent from FIG. 11A, among the sample where the protrusion remains on the Z' surface of the crystal element, the sample where the Z' surface of the crystal element is constituted of the four first to fourth surfaces, and the sample according to this disclosure where the Z' surface of the crystal element is constituted of the three, first to third surfaces, the impedance of the sample according to this disclosure is found to be small. Accordingly, it has been found that the third inclined portion 16 and the fourth inclined portion 18, which are illustrated in FIG. 1A, are preferably the inclined portions constituted of the first to the third surfaces 24a to 24c.

FIG. 11B is an explanatory drawing illustrating the first to the third surfaces 24a, 24b, and 24c according to this disclosure. Specifically, FIG. 11B indicates the experimental result by the inventors according to this application, and indicates the difference of the etching speed in various crystal surfaces of the crystal with a hydrofluoric acid-based etchant. More specifically, FIG. 11B indicates the angles where the AT-cut principal surface as a reference is rotated with the X-axis of the crystal as a rotation axis on the horizontal axis, and indicates the etching speeds of the respective crystal surfaces obtained by rotating an AT-cut plate as described above on the vertical axis. The etching speeds of the respective surfaces are indicated by the relative value as a reference etching speed of the AT-cut surface.

As apparent from FIG. 11B, it has found that the crystal has the maximum etching speed on each surface of a surface corresponding to a surface where the AT-cut principal surface is rotated by $\theta 1$, a surface corresponding to a surface where the AT-cut principal surface is rotated by $\theta 2$, and a surface corresponding to a surface where the AT-cut principal surface is rotated by $\theta 3$. Then, $\theta 1$ is near 4°, $\theta 2$ is near −57°, and $\theta 3$ is near −42°. Furthermore, the experiment by the inventor has found that, in the region where the impedance is good as described with reference to FIG. 11A, the angles are: $\theta 1=4°\pm 3.5°$, $\theta 2=-57°\pm 5°$, and $\theta 3=-42°\pm 5°$, and more preferably, $\theta 1=4°\pm 3°$, $\theta 2=-57°\pm 3°$, and $\theta 3=-42°\pm 3°$. Each surface specified by these $\theta 1$ to $\theta 3$ corresponds to the first to the third surfaces according to this disclosure.

4-2. Extraction Electrode

The following description describes experimental results on a method for extracting the extraction electrode. The experiment focuses on the dimension of the excitation electrode 26 along the X direction of the crystal axis and the length of the extraction electrode 28, which are illustrated in FIG. 3A to FIG. 3E. Sample groups with two levels, level A: the X dimension of the excitation electrode 26 is long and the length of the extraction electrode 28 is short, and level B: compared with level A, the X dimension of the excitation electrode 26 is short and the length of the extraction electrode 28 is long are used. The difference in CI (the crystal impedance) when the extraction angle θ of the extraction electrode was changed was examined.

Figure 12A:
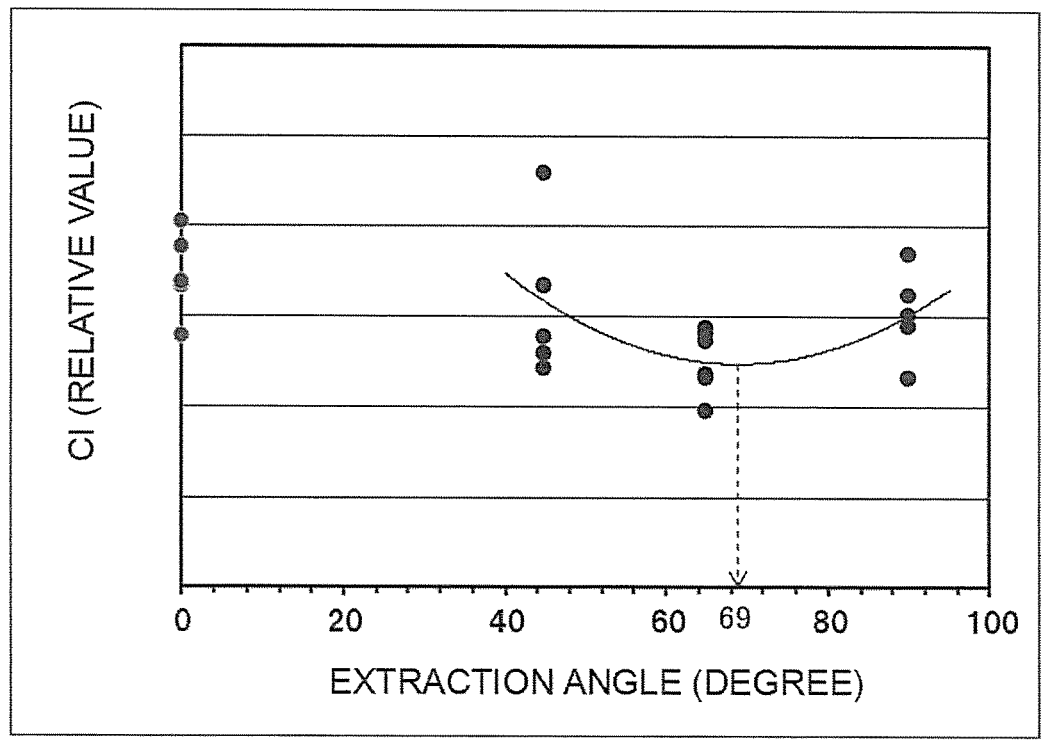
FIG. 12A and FIG. 12B are explanatory drawings describing an effect of an extraction angle of an extraction electrode of the crystal unit according to the embodiment.
Figure 12B:
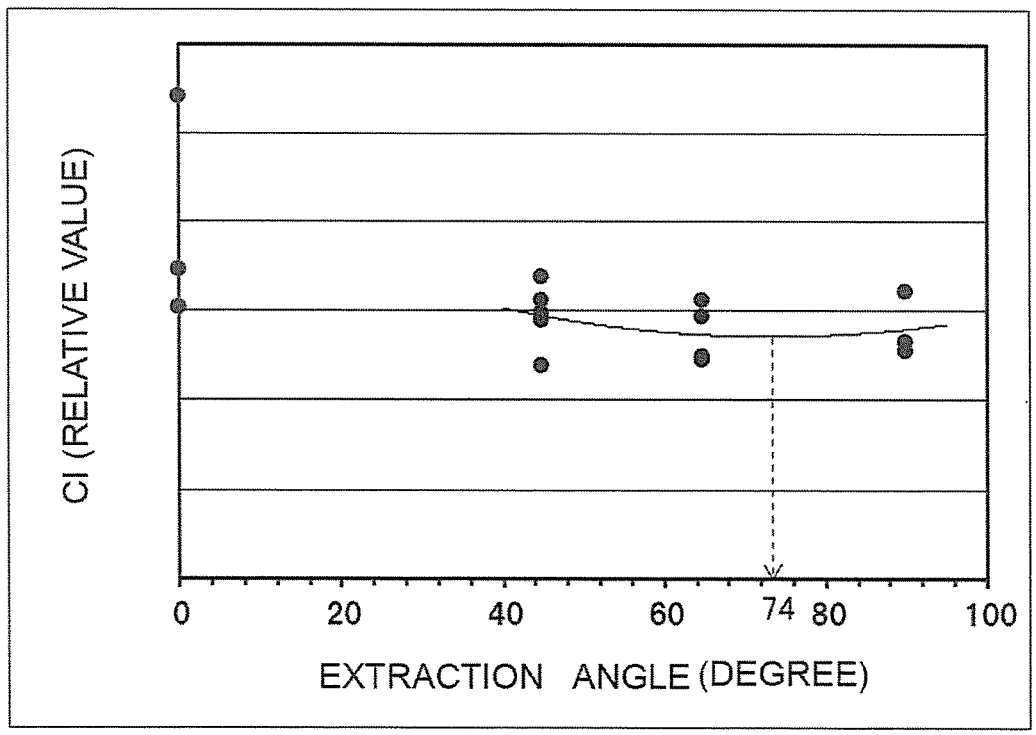

FIG. 12A illustrates a relationship between the extraction angle θ and the CI of the crystal unit in the sample group with level A. FIG. 12B illustrates a relationship between the extraction angle θ and the CI of the crystal unit in the sample group with level B. All drawings indicate the extraction angle θ on the horizontal axis and the CI (the relative value) on the vertical axis.

The CI was examined on samples with four conditions, the extraction angle θ of 0 degrees, 45 degrees, 65 degrees, and 90 degrees, in both level A and level B. The following description has been found. In both level A and level B, compared with the case of the extraction angle of 0 degrees, that is, the case where an extraction electrode goes through neither the third inclined portion nor the fourth inclined portion, the case where the extraction electrode goes through the third inclined portion and the fourth inclined portion with the predetermined extraction angle θ value in a range of 45 to 90 degrees produces a small CI. Specifically, the following description has been found. In level A, the CI is smaller at the extraction angle θ of 69 degrees compared with other angles (FIG. 12A). In level B, the CI is smaller at the extraction angle θ of 74 degrees compared with other angles (FIG. 12B).

The range of the extraction angle in which CI worsens by 2% with respect to the CI values at these preferable angles of 69 degrees and 74 degrees was examined. It has been found that the angle was equal to or greater than 59 degrees and equal to or less than 87 degrees in level A and equal to or greater than 62 degrees and equal to or less than 75 degrees in level B. Further examination of the range of the extraction angle in which the CI worsens by 1% with respect to the CI values at these preferable angles of 69 degrees and 74 degrees found that the angle was equal to or greater than 64 degrees and equal to or less than 74 degrees in level A and equal to or greater than 63 degrees and equal to or less than 83 degrees in level B. These amounts of worsening such as 2% and 1% can be considered as a reference of a threshold of the CI value for designing crystal units; therefore, it is preferable to set the extraction angle θ within the respective ranges.

Accordingly, collectively considering the above-described examination results, to improve CI, it has been found that the extraction angle θ of the extraction electrode 28 is preferably equal to or greater than 59 degrees and equal to or less than 87 degrees, more preferably equal to or greater than 62 degrees and equal to or less than 75 degrees, and further preferably equal to or greater than 64 degrees and equal to or less than 74 degrees.

5. Other Embodiments

The above-described example describes the structure where, as illustrated in FIG. 3A to FIG. 3E, the extraction electrode 28 goes from the excitation electrode 26 through only the third inclined portion 16 or only the fourth inclined portion 18 with the extraction angle θ and then reaches the second inclined portion 14 or the first inclined portion 12. However, when the extraction electrode 28 goes through the third inclined portion 16, a part of the extraction electrode 28 may be formed also on the first inclined portion 12 and may be extended. For example, "a part of" is around 10% or less of a width of the excitation electrode 26 in the Z' direction. Up to this extent, even if the extraction electrode 28 protrudes to the first inclined portion 12 side and goes through the third inclined portion 16, vibration energy on the excitation electrode 26 side is less likely to leak to the first secured portion 22a side via the first inclined portion 12, thereby the CI does not substantially worsen.

The θ is more preferably equal to or greater than 62 degrees and equal to or less than 75 degrees. The θ is further preferably equal to or greater than 64 degrees and equal to or less than 74 degrees. This is because of the following reason. The extraction angle θ at the above-described predetermined value ensures reducing an amount of a leakage of vibration energy depending on the extraction angle of the extraction electrode compared with the case other than that. Accordingly, the improvement in CI is achieved. The details will be described later in the "4. Explanation of Experimental Results" section.

To embody this disclosure, the following embodiment is preferable. The side surface is an inclined portion inclined such that the crystal element decreases in thickness to an end of the crystal element along a Z'-axis of the crystallographic axis of the crystal. The side surface has three, first to third surfaces. The first surface is an inclined portion of a surface corresponding to a surface where an X-Z' surface expressed by the crystallographic axes of the crystal (the principal surface) of the crystal element is rotated by 4±3.5° with an X-axis of the crystal as a rotation axis. The extraction electrode is extracted via the first surface.

Such inclined portion ensures reducing an amount of a leakage of vibration energy depending on the shape of the side surface intersecting with the Z'-axis of the crystal element compared with the case other than that, thereby ensuring the improvement in CI.

In this preferable example, typically, the following embodiment is preferable. The first surface, the second surface, and the third surface intersect in this order. The second surface is a surface corresponding to a surface where the principal surface is rotated by −57±5° with the X-axis of the crystal as a rotation axis. The third surface is a surface corresponding to a surface where the principal surface is rotated by −42±5° with the X-axis of the crystal as a rotation axis.

With the crystal unit according to the embodiments, the extraction angle of the extraction electrode is optimized, thereby ensuring the improvement in CI compared with that of the conventional crystal unit. With the preferable example, the side surface shape of the crystal element is optimized, thereby ensuring the improvement in CI also in the side surface shape compared with that of the conventional crystal unit. Combined with the extraction angle of the extraction electrode, this feature ensures improving CI compared with that of the conventional crystal unit.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A crystal unit, comprising:
an AT-cut crystal element, having a planar shape which is approximately a rectangular shape,
excitation electrodes, disposed on front and back of principal surfaces of the AT-cut crystal element; and
extraction electrodes, extended from the excitation electrodes to a side of one side of the AT-cut crystal element via a side surface of the AT-cut crystal element, wherein assuming that an extraction angle of the extraction electrode from the principal surface to the side surface is defined as an angle θ with respect to an X-axis of a crystallographic axis of a crystal of the AT-cut crystal element, the angle θ is equal to or greater than 59 degrees and equal to or less than 87 degrees.

2. The crystal unit according to claim 1, wherein angle θ is equal to or greater than 62 degrees and equal to or less than 75 degrees.

3. The crystal unit according to claim 1, wherein the angle θ is equal to or greater than 64 degrees and equal to or less than 74 degrees.

4. The crystal unit according to claim 1, wherein the side surface is an inclined portion inclined such that the AT-cut crystal element decrease in thickness to an end of the AT-cut crystal element along a Z'-axis of the crystallographic axis of the crystal, the side surface having three surfaces which are a first surface, a second surface and a third surface, the first surface is an inclined portion of a surface corresponding to a surface where an X-Z' surface as the principle surface expressed by the crystallographic axis of the crystal of the AT-cut crystal element is rotated by 4°±3.5° with an X-axis of the crystal as a rotation axis, and the extraction electrode is extracted via the first surface.

5. The crystal unit according to claim 4, wherein the first surface, the second surface, and the third surface intersect in this order, the second surface is a surface corresponding to a surface where the principal surface is rotated by −57°±5° with the X-axis of the crystal as a rotation axis, and the third surface is a surface corresponding to a surface where the principal surface is rotated by −42°±5° with the X-axis of the crystal as a rotation axis.

* * * * *